United States Patent
Jeffries et al.

[11] Patent Number: 5,815,371
[45] Date of Patent: Sep. 29, 1998

[54] MULTI-FUNCTION HEAT DISSIPATOR

[75] Inventors: John Jeffries, Marble Falls; Ray Wang, Austin, both of Tex.

[73] Assignee: Dell U.S.A., L.P., Round Rock, Tex.

[21] Appl. No.: 718,972

[22] Filed: Sep. 26, 1996

[51] Int. Cl.$^6$ .................................................. H05K 7/20
[52] U.S. Cl. .................. 361/704; 361/688; 361/690; 361/703; 361/707; 361/709; 361/711; 361/719; 361/720; 165/80.3; 165/185; 257/718; 257/719; 257/722
[58] Field of Search ...................... 361/688, 690, 361/703, 704, 717, 718, 719, 720, 721, 722; 165/80.3, 185; 257/718, 719

[56] References Cited

U.S. PATENT DOCUMENTS

| | | |
|---|---|---|
| 3,180,404 | 4/1965 | Nelson et al. . |
| 4,277,816 | 7/1981 | Dunn et al. . |
| 4,441,140 | 4/1984 | Richard .................................. 361/386 |
| 4,463,569 | 8/1984 | McLarty . |
| 4,489,363 | 12/1984 | Goldberg . |
| 4,607,685 | 8/1986 | Mitchell, Jr. . |
| 4,631,641 | 12/1986 | Brombal et al. ........................ 361/818 |
| 4,669,028 | 5/1987 | Faa, Jr. ..................................... 361/386 |
| 4,675,783 | 6/1987 | Murase et al. . |
| 4,953,634 | 9/1990 | Nelson et al. . |
| 5,002,123 | 3/1991 | Nelson et al. . |
| 5,109,318 | 4/1992 | Funari et al. ............................ 361/388 |
| 5,184,281 | 2/1993 | Samarov et al. ....................... 165/80.3 |
| 5,381,314 | 1/1995 | Rudy, Jr. et al. ....................... 361/712 |

FOREIGN PATENT DOCUMENTS

| | | |
|---|---|---|
| 0276606 | 3/1988 | European Pat. Off. . |
| 228355 | 1/1990 | Japan . |
| 3135098 | 6/1991 | Japan . |
| 521666 | 1/1993 | Japan . |
| 595062 | 4/1993 | Japan . |
| 5259325 | 10/1993 | Japan . |

OTHER PUBLICATIONS

IBM Technical Disclosure Bulletin authored by R.E. Simons, entitled Micro–Modular Air–Cooling Scoop, dated Jun. 1979, pp. 240–241.

1997 Intel Corporation Bulletin entitled, *Pentium II Processor*.

*Primary Examiner*—Leo P. Picard
*Assistant Examiner*—Boris L. Chervinsky
*Attorney, Agent, or Firm*—Haynes and Boone, L.L.P.

[57] ABSTRACT

A method and apparatus simultaneously supporting a circuit board and dissipating heat from an electrical device on the circuit board. In a computer including the circuit board and a mother board connected to the circuit board, a heat dissipator not only dissipates any heat produced by the electrical device, but also secures the circuit board to the mother board. The heat dissipator includes three frame plates and two support plates, each made of a thermally conductive material. The first frame plate is directly connected to the electrical device. The first and second frame plates are proximate to and parallel with the front and back faces of the circuit board, respectively and the third frame plate connects the first and second frame plates. The first and second support plates attach the first and second frame plates, respectively, to the mother board.

16 Claims, 1 Drawing Sheet

MULTI-FUNCTION HEAT DISSIPATOR

TECHNICAL FIELD

The invention relates generally to the fields of heat transfer devices and circuit board devices and, more particularly, to a method and apparatus for simultaneously supporting and protecting a circuit board while dissipating heat from an electrical device on the circuit board.

BACKGROUND OF THE INVENTION

Electrical devices such as semiconductor integrated circuits, or "chips", are advancing in many ways. For example, many chips are seeing an increase in operating speed, overall size, and number of transistors. These advancements, while creating smaller and faster electrical devices, result in increased power consumption and heat generation inside the chip. Many such chips consume more than 30 watts of power and therefore create a very large amount of heat.

The detrimental effects of excessive heat inside a chip, such as reduction of the extended life and reliability of the chip, are well known in the art. As a result, designers of computers and other electronic circuits have utilized various techniques to remove, or dissipate, heat from the chip or electrical device. Two such techniques involve heat convection and conduction. An example of conduction is a heat spreader thermally coupled to the chip. Heat flows from the chip to the heat spreader. The heat spreader is sufficiently large so that it can receive a large amount of heat from the chip and can efficiently radiate the heat, thereby cooling the chip. An example of convection is a heat sink thermally coupled to the chip, combined with a moving air mass. Heat flows from the chip to the heat sink, and as the air mass moves across the surface of the heat sink, heat is transferred to the air mass, where it is carried away from the heat sink and the attached chip.

In addition to the advancements in chip design, computer designs are shrinking in size, despite the fact that more and more chips and electrical devices are being included in a single computer. By crowding many different chips on a single circuit board, such as a mother board, changes to the computer design are difficult to achieve. As a result, daughter boards are often used to allow additional components to be included with the mother board. Daughter boards are small circuit boards that are connected to the mother board in order to add additional chips and electrical devices to the mother board. Daughter boards are well known in the art of computer design.

One sample application for the daughter board is to provide a second processor chip to a mother board that already has a first processor chip. In this way, a single mother board can easily support a single processor or a multi-processor computer system. However, because of the high amount of heat dissipated by these processor chips, a heat dissipator such as a heat sink or heat spreader must be attached to each.

There are many problems associated with attaching heat dissipators to chips on a daughter board. First of all, because daughter boards are often perpendicularly attached to the mother board through a connector, the daughter boards are subject to damage due to shock and vibration. In addition, heat dissipators are often heavy and cumbersome, and due to the arrangement of the daughter board on the mother board, must be securely fastened to the chip. Furthermore, as with all design solutions for modern computers, space constraints, cost, and reliability are always important considerations.

Therefore, what is needed is a method and apparatus for dissipating the heat generated by a chip on a daughter board that helps the daughter board to withstand shock and vibration.

Furthermore, what is needed is a method and apparatus for dissipating the heat from a chip on a daughter board that can be easily attached to the chip.

Further still, what is needed is a method and apparatus for dissipating heat from a chip that is relatively small, inexpensive and reliable.

SUMMARY OF THE INVENTION

The present invention, accordingly, provides a heat dissipator that serves multiple functions. In a computer including a mother board, a daughter board connected to the mother board, and an electrical device connected to the daughter board, the heat dissipator not only dissipates heat generated by the electrical device, but also supports and secures the daughter board to the mother board.

The heat dissipator includes three frame plates and two support plates, each made of a thermally conductive material. The first frame plate is directly connected to the electrical device. The first and second frame plates are proximate to and parallel with the front and back faces of the daughter board, respectively and the third frame plate connects the first and second frame plate. The first and second support plates attach the first and second frame plates, respectively, to the mother board. As a result, the heat dissipator not only dissipates heat, but helps to secure the daughter board to the mother board.

In one embodiment, the support plates are thermally connected to a ground plane in the mother board. As a result, any heat dissipated from the electrical device is dissipated in two different paths: one through the frame plates acting as a heat sink and another through the ground plane, thereby allowing the ground plane to act as a heat spreader.

In addition, the combination of the frame plates, support plates and the ground plane provide an electrical conduction path around the electrical device. As a result, the combination serves to reduce any electromagnetic interference emanating from the electrical device.

Furthermore, the third frame plate has a notch in it that matches with the daughter board. The daughter board is placed into the notch and is thereby further secured by the heat dissipator.

DETAILED DESCRIPTION OF THE PREFERRED EMBODIMENT

The preferred embodiment of the present invention is utilized in a personal computer such as a desktop computer or a tower computer. The personal computer comprises circuit boards, such as a mother board, for mounting and interconnecting various electrical circuits and devices such as one or more semiconductor integrated circuit devices, or "chips." It is understood, however, that the present invention may be utilized by many different heat producing apparatuses, including discrete circuits and power supplies.

Figure 1:
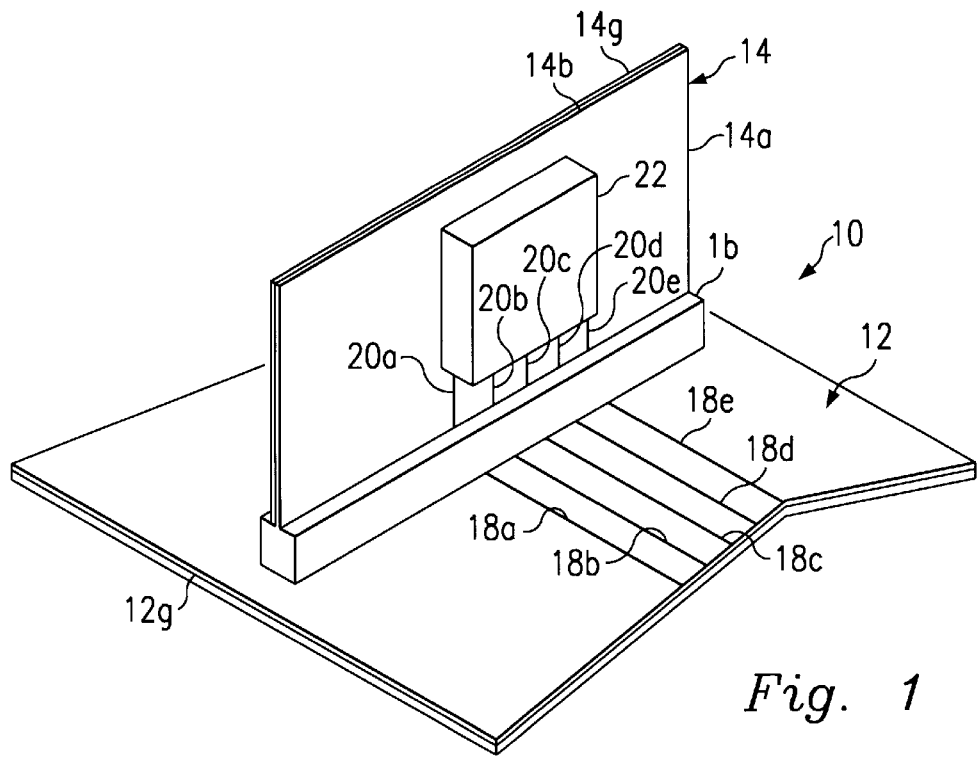
FIG. 1 is a diagram of a computer chip on a daughter board connected to a mother board.

Referring to FIG. 1, reference numeral 10 generally designates a circuit that is utilized by the personal computer (not shown). The circuit 10 includes a mother board 12 and a daughter board 14, which are connected by an electrical connecter 16. Both the mother board 12 and daughter board 14 include a plurality of electrical traces, or conductors, represented by traces 18*a–e* and traces 20*a–e*, respectively. The connector 16 electrically connects the traces 18*a–e* to traces 20*a–e*, respectively. The traces 18*a–e* are also electrically connected to various components (not shown) attached or connected to the mother board 12. The traces 20*a–e* are electrically connected to a chip 22 attached to the front face 14*a* of the daughter board 14 by a conventional soldering technique, or other techniques well known in the art. Built into both the mother board 12 and daughter board 14 are ground planes 12*g*, 14*g*, which are also electrically connected through the connector 16. The ground planes 12*g*, 14*g* are conventionally designed to provide a large, stable ground voltage source for the chip 22 and other components of the circuit 10.

The connector 16 is permanently secured to the mother board 12. The daughter board 14 is frictionally secured to the connector 16 to stand perpendicularly erect from the mother board 12. The use of the daughter board 14 with the mother board 12 not only provides additional space on the mother board by having the chip 22 located off of the mother board, but also allows the circuit 10 to have different configurations by selectively providing or removing the daughter board. For example, the mother board 12 may comprise a first processor (not shown), and the chip 22 may be a second processor. In this way, when the daughter board 14 is inserted into the connector 16, the circuit 10 has a multi-processor configuration and when the daughter board 14 is removed from the connector 16, the circuit 10 has a single processor configuration.

Figure 2:
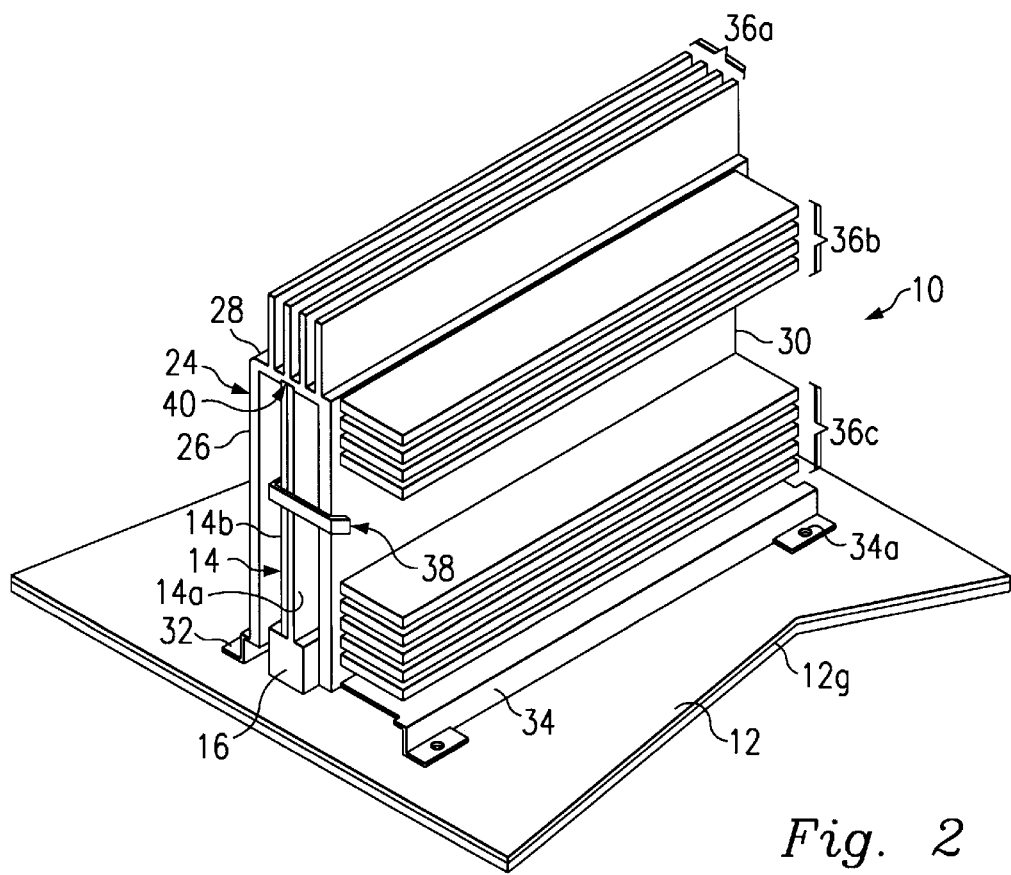
FIG. 2 is a diagram of the daughter board and mother board of FIG. 1 with a heat dissipator according to the present invention.

Referring to FIG. 2, attached to both the daughter board 14 and the mother board 12 is a heat dissipator 24. Although not shown, the heat dissipator 24 is thermally connected to the chip 22 in order to dissipate heat produced therefrom. The heat dissipator 24 has three frame plates 26, 28, 30 and two support plates 32, 34. In the preferred embodiment, the frame plates and support plates 26–34 represent different portions of one continuous metal plate. However, an alternate embodiment may have one or more thermally conductive plates separately formed, and attached by thermal glue or weld. The frame plate 26 is proximate to and parallel with the back face 14*b* of the daughter board 14. The frame plate 28 is connected to the frame plate 26 and has one group of radiant fins 36*a*. The frame plate 30 is proximate to and parallel with the front face 14*a* of the daughter board 14 and has two groups of radiant fins 36*b*, 36*c*. The radiant fins 36*a–c* work with the frame plates to convect heat from the heat chip 22 into a surrounding air mass (not shown).

The support plates 32, 34 provide a system for mounting the heat dissipator 24 to the mother board 12. In the preferred embodiment, the support plates 32, 34 include screw holes, such as screw hole 34*a*, for attaching the heat dissipator 24 to the mother board 12 with screws (not shown). In addition to being a mechanical fastener, the screws also serve as heat and electrical conductors, as discussed in greater detail below. Furthermore, it is understood that other attaching devices such as metal clips can be used in a manner equivalent to the screws.

The frame plates 26–30 also provide mechanical support to the daughter board 14. First of all, the frame plate 30 is attached to the daughter board 14 with a metal clip 38. Secondly, the frame plate 28 includes a notch 40 for receiving and securing the daughter board 14. The notch 40 not only prevents the daughter board 14 from vibrating back and forth, but also prevents the daughter board from releasing from the connector 16. Thirdly, because the frame plate 30 is secured both to the mother board 12 through the support plates 32, 34 as well as to the chip 22, the daughter board 14, which is secured to the chip, is thereby secured to the mother board.

In addition to attaching the heat dissipator 24 to the mother board 12, the support plates 32, 34 are electrically and thermally connected to the ground plane 12*g* of the mother board through the screws. This has several benefits. First of all, the ground plane 12*g* acts as a heat spreader for heat dissipating through the support plates 32, 34. Secondly, when a conventional heat dissipator is coupled to an electrical device, the conventional heat dissipator acts like an antenna, broadcasting electromagnetic interference (EMI) of various harmonic frequencies from the exterior of the electrical device. However, because the heat dissipator 24 of the present invention electrically "wraps around" the chip 22 with the support plates 26, 28, 30 and the ground plane 12*g*, the heat dissipator, in conjunction with ground plane, acts as a Faraday cage for the chip thereby reducing the EMI.

It is understood that the heat dissipator 24 can take many forms and embodiments, the embodiments shown herein are intended to illustrate rather than limit the invention. Therefore, variations may be made without departing from the spirit of the invention. Furthermore, the heat dissipator 24 may be utilized in applications other than computer or electronics applications. Accordingly, it is appropriate that the appended claims be construed broadly and in a manner consistent with the scope of the invention.

What is claimed is:

1. A computer comprising:
   a mother board;
   a daughter board connected to the mother board through a connector at a first end of the daughter board;
   an electrical device connected to a first face of the daughter board, the electrical device generating heat;
   a heat dissipator coupled to the electrical device for dissipating the heat, the heat dissipator comprising a first frame plate parallel to the first face of the daughter board, adjacent the electrical device, a second frame plate parallel to a second face of the daughter board, opposite the first face, and a third frame plate transverse to and interconnected with the first and second frame plates;
   a first daughter board support including a notch formed in the third frame plate for receiving a second end of the daughter board opposite the first end, and for limiting the daughter board from movement away from the connector; and
   a second daughter board support including a clip connected between the first and second ends of the daughter board and further connected to at least one of the frame plates parallel to the daughter board for limiting the daughter board from vibrating.

2. The computer of claim 1 wherein the heat dissipator further comprises a first and a second support plate attached to the mother board and wherein the first and second support plates are attached to the first and second frame plates, respectively.

3. The computer of claim 1 wherein at least one of the frame plates include radiant fins attached thereto.

4. The computer of claim 1 wherein the mother and daughter boards are physically and electrically connected through the circuit board connector.

5. The computer of claim 2 wherein the mother board includes a ground plane and the first and second support plates are thermally and electrically connected to the ground plane.

6. The computer of claim 5 wherein the first, second and third frame plates and the ground plane wrap around the electrical circuit in order to reduce electromagnetic interference.

7. The computer of claim 1 wherein the mother board is perpendicular to the daughter board.

8. A method for securing a daughter board to a mother board and simultaneously dissipating heat from an electrical device on the daughter board, the method comprising the steps of:

connecting a first end of the daughter board to a connector on the mother board;

mounting a heat generating electrical device on a first face of the daughter board;

mounting a heat dissipator on the mother board and adjacent the daughter board;

providing a first frame plate of the heat dissipator parallel to the first face of the daughter board adjacent the electrical device;

providing a second frame plate of the heat dissipator parallel to a second face of the daughter board, opposite the first face;

providing a third frame plate of the heat dissipator transverse to and interconnected with the first and second frame plates;

forming a first daughter board support comprising a notch in the third frame plate for receiving a second end of the daughter board opposite the first end, and for limiting the daughter board from movement away from the connector; and connecting a second daughter board support comprising a clip connected between the first and second ends of the daughter board and at least one of the frame plates parallel to the daughter board for limiting the daughter board from vibrating.

9. The method of claim 8 further comprising the step of connecting the first and second frame plates to the mother board by using a first and second support plate.

10. The method of claim 8 further comprising the step of providing at least one of the frame plates with radiant fins attached thereto.

11. The method of claim 9 further comprising the step of thermally connecting the first and second support plates, the frame plates, the electrical device and a ground plane in the mother board.

12. The method of claim 8 further comprising the step of mounting the daughter board perpendicular to the mother board.

13. An apparatus for securing a daughter board to a mother board and simultaneously dissipating heat from a heat generating electrical component on the daughter board, the apparatus comprising:

a first end of the daughter board connected to the mother board through a connector;

a heat dissipator coupled to the electrical component, the heat dissipator comprising a first frame plate parallel to a first face of the daughter board adjacent the electrical component, a second frame plate parallel to a second face of the daughter board, opposite the first face, and a third frame plate transverse to and interconnected with the first and second frame plates:

a first daughter board support including a notch formed in the third frame plate for receiving a second end of the daughter board opposite the first end, and for limiting movement of the daughter board away from the connector; and a second daughter board support including a clip connected between the first and second ends of the daughter board and further connected to at least one of the frame plates parallel to the daughter board for limiting the daughter board from vibrating.

14. The apparatus of claim 13 further comprising a first and second support plate for attaching the first and second frame plates to the mother board.

15. The apparatus of claim 13 wherein at least one of the frame plates includes radiant fins.

16. The apparatus of claim 14 wherein the mother board includes a ground plane and wherein the first and second support plates, the frame plates, and the ground plane are electrically connected.

* * * * *